United States Patent
Kim et al.

(10) Patent No.: US 11,735,494 B2
(45) Date of Patent: *Aug. 22, 2023

(54) SEMICONDUCTOR PACKAGE

(71) Applicant: Samsung Electronics Co., Ltd., Suwon-si (KR)

(72) Inventors: Hee-Jeong Kim, Seoul (KR); Juhyun Lyu, Cheonan-si (KR); Un-Byoung Kang, Hwaseong-si (KR); Jongho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/408,988

(22) Filed: Aug. 23, 2021

(65) Prior Publication Data

US 2021/0384101 A1   Dec. 9, 2021

Related U.S. Application Data

(63) Continuation of application No. 16/223,642, filed on Dec. 18, 2018, now Pat. No. 11,114,364.

(30) Foreign Application Priority Data

Jul. 11, 2018   (KR) ........................ 10-2018-0080463

(51) Int. Cl.
  *H01L 23/373* (2006.01)
  *H01L 23/31* (2006.01)
  *H01L 23/367* (2006.01)

(52) U.S. Cl.
  CPC ...... *H01L 23/3735* (2013.01); *H01L 23/3185* (2013.01); *H01L 23/367* (2013.01)

(58) Field of Classification Search
  CPC ... H01L 23/3735; H01L 23/367; H01L 23/42; H01L 23/3185; H01L 25/042; H01L 25/0655; H01L 25/072; H01L 25/0753
  See application file for complete search history.

(56) References Cited

U.S. PATENT DOCUMENTS

| 5,001,548 A | 3/1991 | Iversen |
| 5,789,810 A | 8/1998 | Gross et al. |

(Continued)

FOREIGN PATENT DOCUMENTS

| EP | 1616337 A2 | 1/2006 |
| JP | 2002-080617 A | 3/2002 |

(Continued)

*Primary Examiner* — Tuan A Hoang
(74) *Attorney, Agent, or Firm* — Harness, Dickey & Pierce, P.L.C.

(57) ABSTRACT

Disclosed is a semiconductor package comprising first and second semiconductor structures spaced apart on a first substrate, a heat sink covering the first and second semiconductor structure and the first substrate, and a thermal interface material layer between the heat sink and the first and second semiconductor structures. The first semiconductor structure includes a first sidewall adjacent to the second semiconductor structure and a second sidewall opposite the first sidewall. The thermal interface material layer includes a first segment between the first and second semiconductor structures and a second segment protruding beyond the second sidewall. A first distance from a top surface of the first substrate to a lowest point of a bottom surface of the first segment is less than a second distance from the top surface of the first substrate to a lowest point of a bottom surface of the second segment.

20 Claims, 17 Drawing Sheets

(56) References Cited

U.S. PATENT DOCUMENTS

| | | | |
|---|---|---|---|
| 6,444,496 B1* | 9/2002 | Edwards | H05K 7/20454 438/584 |
| 6,496,373 B1* | 12/2002 | Chung | H01L 23/433 257/E23.09 |
| 7,031,162 B2 | 4/2006 | Arvelo et al. | |
| 8,269,340 B2 | 9/2012 | Gaynes et al. | |
| 8,409,930 B2 | 4/2013 | Terui et al. | |
| 8,780,561 B2 | 7/2014 | Danello et al. | |
| 8,981,550 B2 | 3/2015 | Park et al. | |
| 9,418,909 B1 | 8/2016 | Chaware et al. | |
| 9,793,191 B2 | 10/2017 | Refai-Ahmed | |
| 9,892,990 B1 | 2/2018 | Galloway et al. | |
| 9,917,042 B2 | 3/2018 | Haba et al. | |
| 11,114,364 B2* | 9/2021 | Kim | H01L 23/053 |
| 2004/0124512 A1 | 7/2004 | Tao et al. | |
| 2006/0192282 A1 | 8/2006 | Suwa et al. | |
| 2007/0164424 A1 | 7/2007 | Dean et al. | |
| 2009/0127700 A1* | 5/2009 | Romig | H01L 23/4334 257/E23.101 |
| 2011/0031619 A1 | 2/2011 | Chen et al. | |
| 2012/0119346 A1 | 5/2012 | Im et al. | |
| 2012/0139097 A1 | 6/2012 | Jin et al. | |
| 2014/0368992 A1* | 12/2014 | Strader | H01L 23/42 156/60 |
| 2016/0093598 A1 | 3/2016 | Jo et al. | |
| 2016/0218081 A1* | 7/2016 | Kim | H01L 24/20 |
| 2016/0225742 A1* | 8/2016 | Davis | H01L 29/0657 |
| 2016/0276308 A1 | 9/2016 | Min et al. | |
| 2017/0251549 A1 | 8/2017 | Lee et al. | |
| 2018/0090411 A1 | 3/2018 | Cetegen et al. | |
| 2018/0350755 A1 | 12/2018 | Huang et al. | |
| 2019/0295952 A1* | 9/2019 | Sikka | H01L 23/5381 |

FOREIGN PATENT DOCUMENTS

| | | |
|---|---|---|
| JP | 2002-353388 A | 12/2002 |
| JP | 2008-305838 A | 12/2008 |
| JP | 2012-109572 A | 6/2012 |
| JP | 2017-536693 A | 12/2017 |
| KR | 10-2013-0024523 A | 3/2013 |
| WO | WO-2004090938 A2 | 10/2004 |

* cited by examiner

SEMICONDUCTOR PACKAGE

CROSS-REFERENCE TO RELATED APPLICATION

This U.S. nonprovisional application is a continuation of U.S. application Ser. No. 16/223,642, filed on Dec. 18, 2018, which claims priority under 35 U.S.C § 119 to Korean Patent Application No. 10-2018-0080463, filed on Jul. 11, 2018 in the Korean Intellectual Property Office, the entire contents of each of which are hereby incorporated by reference.

BACKGROUND

The present inventive concepts relate to semiconductor packages.

A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, many studies have been conducted to improve reliability and durability of semiconductor packages.

SUMMARY

Some example embodiments of the present inventive concepts provide semiconductor packages having improved reliability.

According to an example embodiment of the present inventive concepts, a semiconductor package includes a first substrate, a first semiconductor structure mounted on the first substrate, the first semiconductor structure including a first sidewall and a second sidewall opposite to the first sidewall, a second semiconductor structure mounted on the first substrate and spaced apart from the first semiconductor structure, the second semiconductor structure being adjacent to the first sidewall of the first semiconductor structure, a heat sink covering at least portions of the first semiconductor structure, the second semiconductor structure, and the first substrate, and a thermal interface material layer between the first semiconductor structure and the heat sink and between the second semiconductor structure and the heat sink, the thermal interface material layer including a first thermal interface material segment between the first and second semiconductor structures and a second thermal interface material segment that protrudes beyond the second sidewall, a first distance from a top surface of the first substrate to a lowest point of a bottom surface of the first thermal interface material segment being less than a second distance from the top surface of the first substrate to a lower surface of a bottom surface of the second thermal interface material segment.

According to an example embodiment of the present inventive concepts, a semiconductor package includes a first substrate, a first semiconductor structure mounted on the first substrate, the first semiconductor structure including a first sidewall and a second sidewall opposite to the first sidewall, a second semiconductor structure mounted on the first substrate and spaced apart from the first semiconductor structure, the second semiconductor structure being adjacent to the first sidewall of the first semiconductor structure, a heat sink covering at least portions of the first semiconductor structure, the second semiconductor structure, and the first substrate, and a thermal interface material layer between the first semiconductor structure and the heat sink and between the second semiconductor structure and the heat sink, the thermal interface material layer including a first thermal interface material segment adjacent to the first sidewall and a second thermal interface material segment adjacent to the second sidewall, the first thermal interface material segment being thicker than the second interface material segment.

According to an example embodiment of the present inventive concepts, a semiconductor package includes a package substrate a first semiconductor structure and a second semiconductor structure that are mounted on the package substrate and are spaced apart from each other in a direction parallel to a top surface of the package substrate, a heat sink covering at least portions of the first semiconductor structure, the second semiconductor structure, and the package substrate, and a thermal interface material layer between the first semiconductor structure and the heat sink and between the second semiconductor structure and the heat sink, the thermal interface material layer having different thicknesses according to positions thereof, the thermal interface material layer having a greatest thickness at a position between the first and second semiconductor structures.

DETAILED DESCRIPTION OF EMBODIMENTS

Some example embodiments of the present inventive concepts will now be described in detail with reference to the accompanying drawings to thoroughly and completely explain the present inventive concepts to those skilled in the art.

Figure 1:
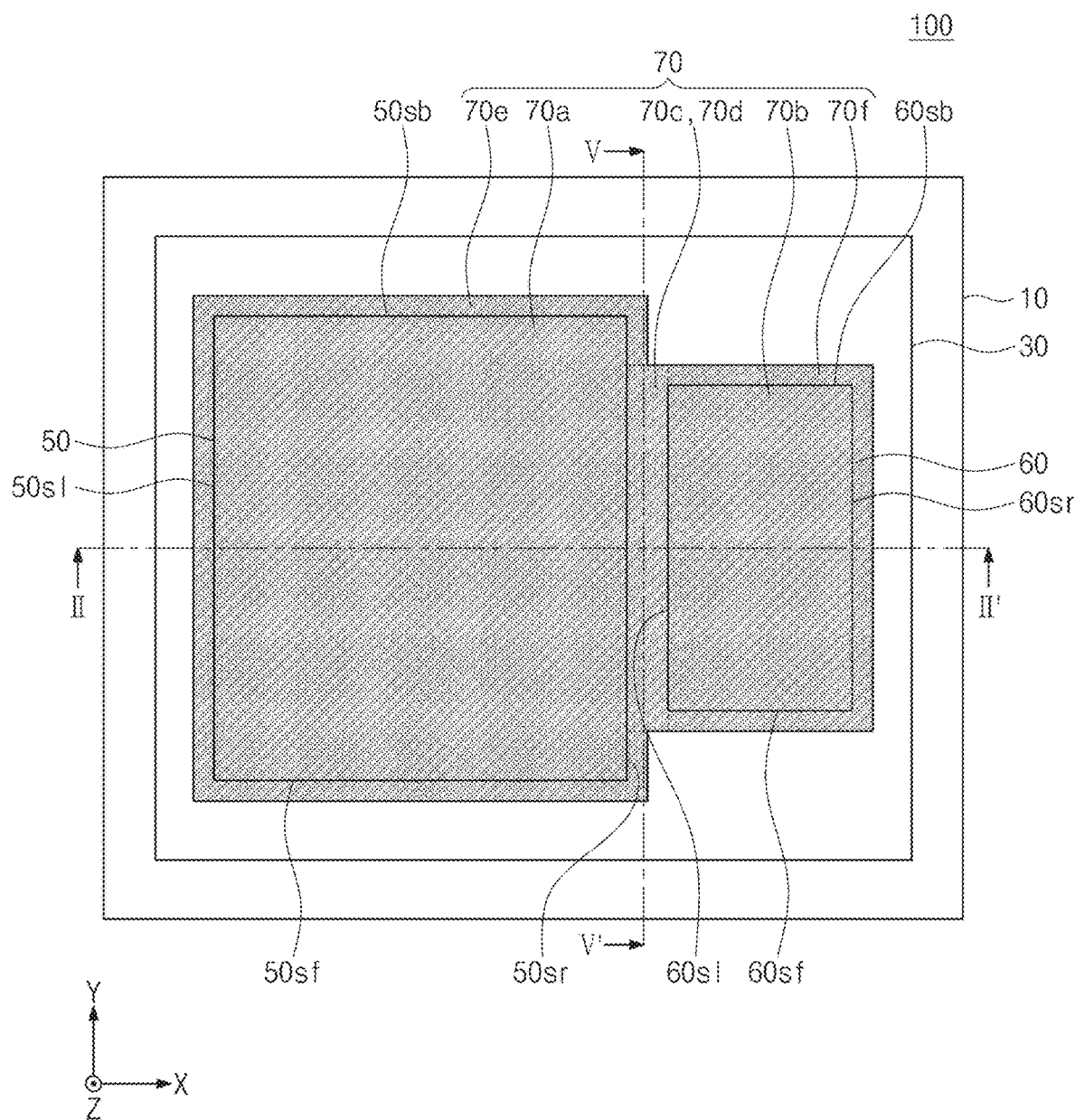
FIG. 1 illustrates a plan view showing a semiconductor package according to an example embodiment of the present inventive concepts.
Figure 2:
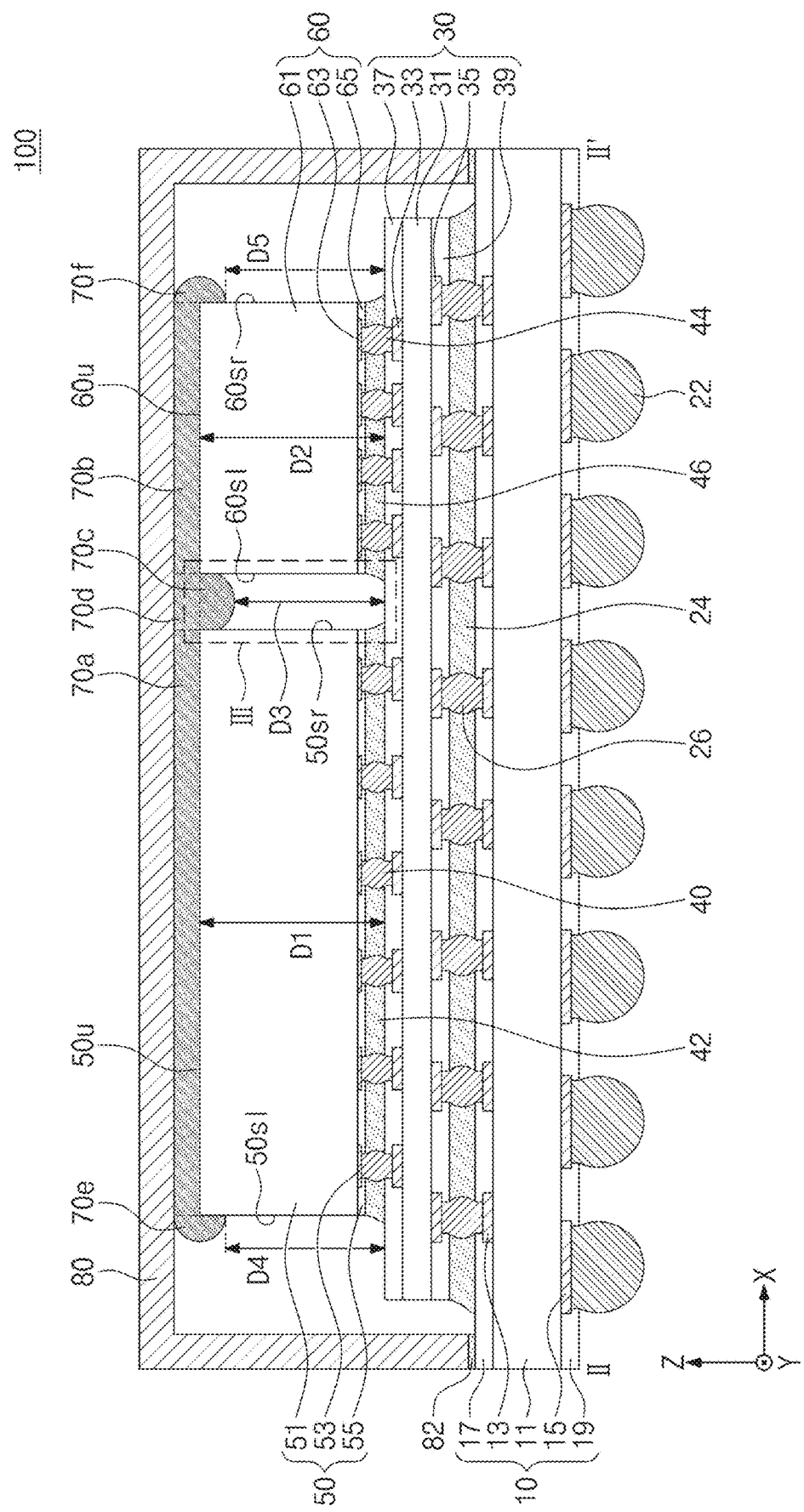
FIG. 2 illustrates a cross-sectional view taken along line II-II' of FIG. 1.
Figure 3:
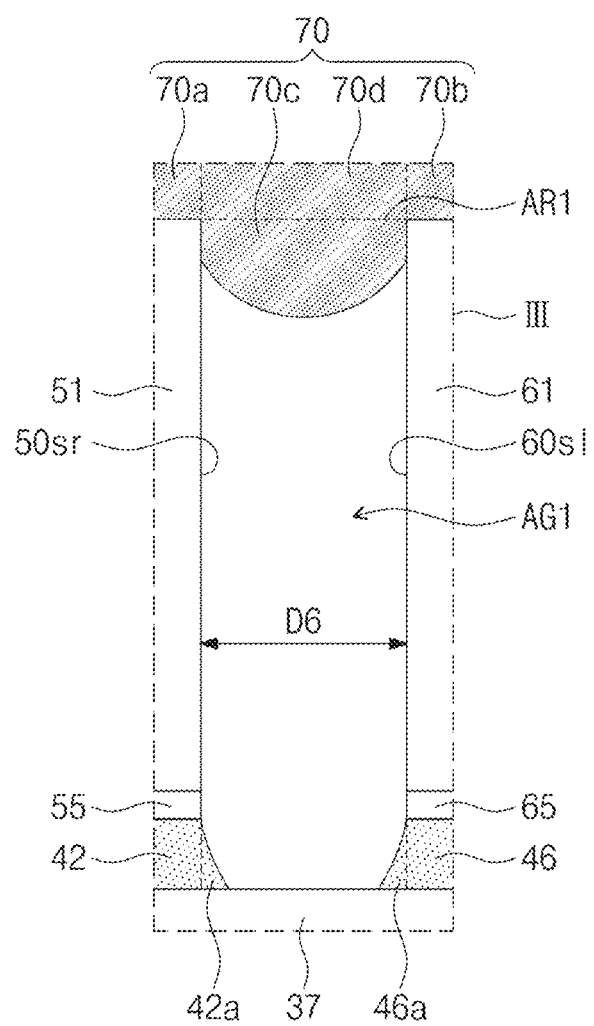
FIG. 3 illustrates an enlarged view showing section III of FIG. 2.
Figure 4:
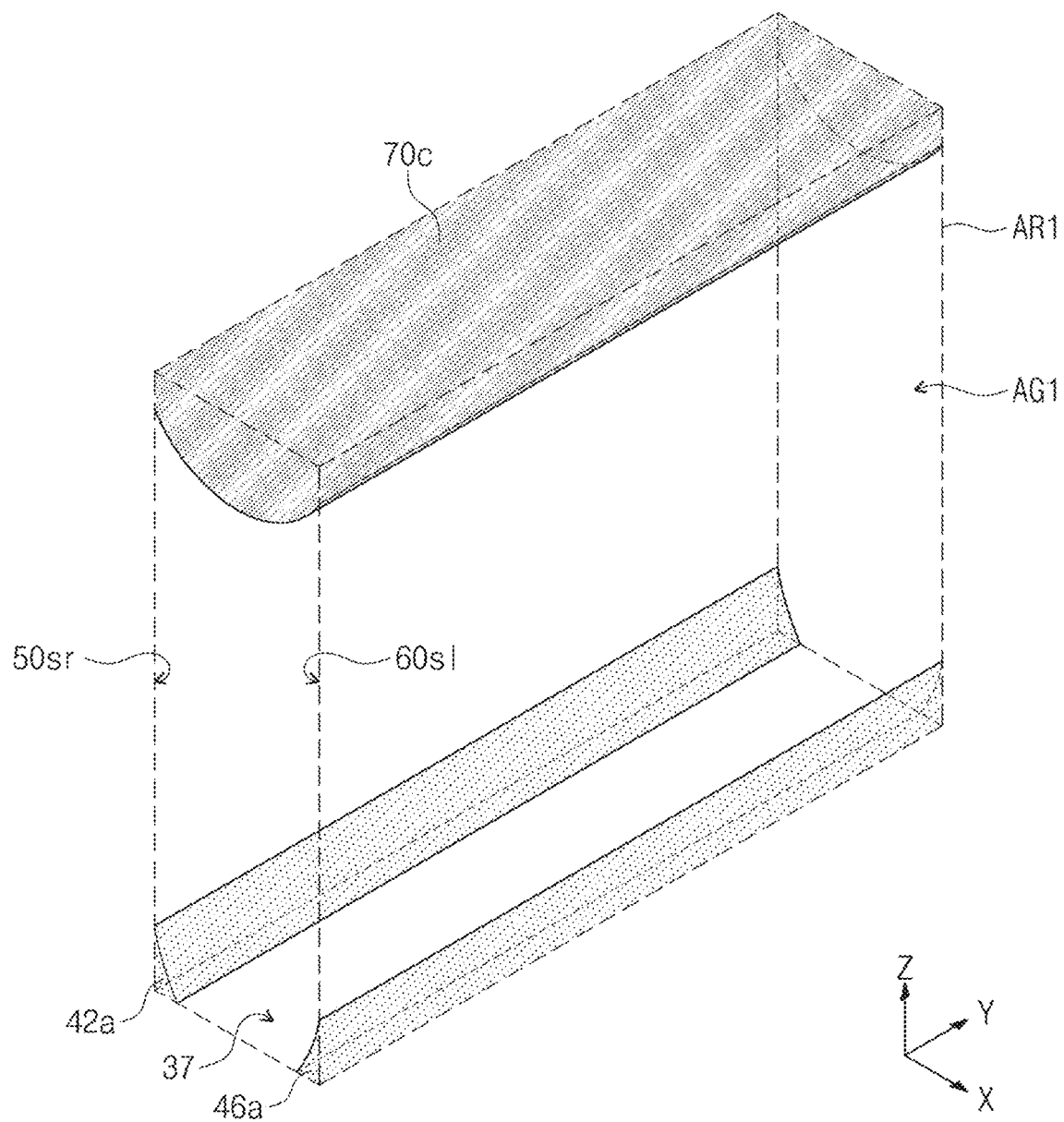
FIG. 4 illustrates a partial perspective view of FIG. 2.
Figure 5:
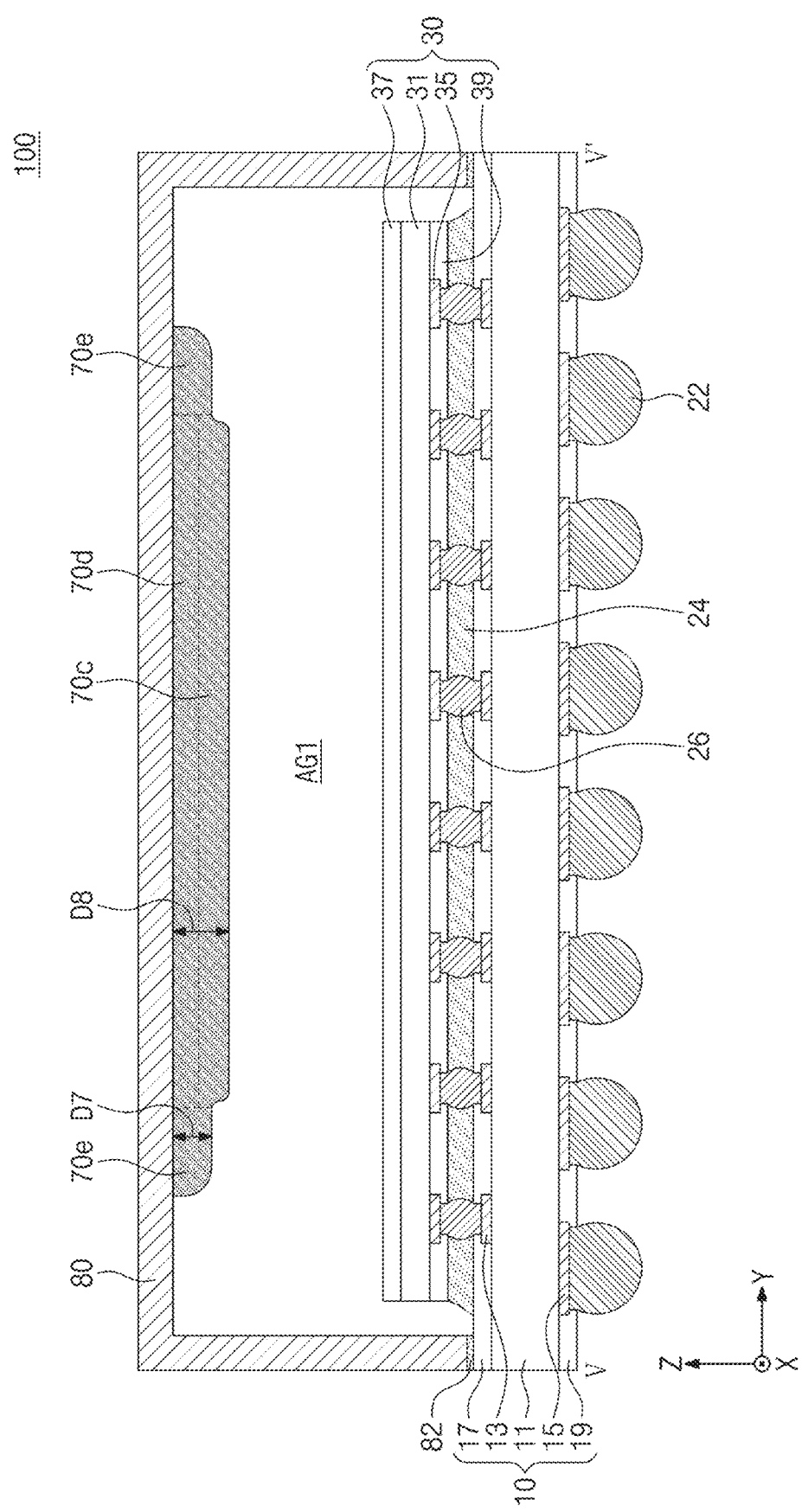
FIG. 5 illustrates a cross-sectional view taken along line V-V' of FIG. 1.

FIG. 1 illustrates a plan view showing a semiconductor package according to an example embodiment of the present inventive concepts. FIG. 2 illustrates a cross-sectional view taken along line II-II' of FIG. 1. FIG. 3 illustrates an enlarged view showing section III of FIG. 2. FIG. 4 illustrates a partial perspective view of FIG. 2. FIG. 5 illustrates a cross-sectional view taken along line V-V' of FIG. 1.

Referring to FIGS. 1 to 5, a semiconductor package 100 may include a first substrate 10. A second substrate 30 may be provided on the first substrate 10. A first semiconductor chip 50 may be mounted on the second substrate 30. A second semiconductor chip 60 may further be mounted on the second substrate 30. The second semiconductor chip 60 may be spaced apart in a first direction X from the first semiconductor chip 50. A heat sink 80 may cover at least portions of the first semiconductor chip 50, the second semiconductor chip 60, the second substrate 30, and the first substrate 10. An adhesive layer 82 may be interposed between the first substrate 10 and a bottom surface of the heat sink 80. A thermal interface material layer 70 may be interposed between the heat sink 80 and the first semiconductor chip 50 and between the heat sink 80 and the second semiconductor chip 60.

The first substrate 10 may be, for example, a printed circuit board. The first substrate 10 may be referred to as a package substrate. The first substrate 10 may include a first core 11, first substrate upper conductive patterns 13 on a top surface of the first core 11, a first substrate upper passivation layer 17 covering the top surface of the first core 11, first substrate lower conductive patterns 15 on a bottom surface of the first core 11, and a first substrate lower passivation layer 19 covering the bottom surface of the first core 11. The first substrate upper conductive patterns 13 may be electrically connected to the first substrate lower conductive patterns 15, although not specifically illustrated in the drawings. External connection terminals 22 may be attached to the first substrate lower conductive patterns 15. The external connection terminals 22 may be, for example, solder balls. The external connection terminals 22 may include, for example, one or more of tin or lead.

The first core 11 may include, but not limited to, a thermosetting resin (e.g., epoxy resin), a thermoplastic resin (e.g., polyimide), a resin (e.g., prepreg) in which a thermosetting or thermoplastic resin is impregnated with a stiffener (e.g., glass fiber and/or inorganic filler), or a photosensitive resin. The first substrate upper passivation layer 17 and the first substrate lower passivation layer 19 may include photosensitive solder resist (PSR). The photosensitive solder resist may include a photosensitive polymer. The photosensitive polymer may include one or more of photosensitive polyimide (PSPI), polybenzoxazole (PBO), phenolic polymer, or benzocyclobutene (BCB) polymer. The photosensitive solder resist may further include an inorganic filler. The first substrate upper conductive patterns 13 and the first substrate lower conductive patterns 15 may include one or more of copper, aluminum, or gold.

The second substrate 30 may be, for example, an interposer substrate. The second substrate 30 may include a second core 31, second substrate upper conductive patterns 33 on a top surface of the second core 31, a second substrate upper passivation layer 37 covering the top surface of the second core 31, second substrate lower conductive patterns 35 on a bottom surface of the second core 31, and a second substrate lower passivation layer 39 covering the bottom surface of the second core 31.

The second core 31 may include, for example, silicon. The second substrate upper passivation layer 37 and the second substrate lower passivation layer 39 may include photosensitive solder resist (PSR). The photosensitive solder resist may include a photosensitive polymer. The photosensitive polymer may include one or more of photosensitive polyimide (PSPI), polybenzoxazole (PBO), phenolic polymer, or benzocyclobutene (BCB) polymer. The photosensitive solder resist may further include an inorganic filler. The second substrate upper conductive patterns 33 and the second substrate lower conductive patterns 35 may include one or more of copper, aluminum, or gold.

The first and second substrates 10 and 30 may be electrically connected to each other through first internal connection terminals 26. The first internal connection terminals 26 may electrically connect the first substrate upper conductive patterns 13 to the second substrate lower conductive patterns 35. The first internal connection terminals 26 may be solder balls, conductive bumps, conductive pillars, or any combination thereof. The first internal connection terminals 26 may include one or more of copper, tin, or lead. A first under-fill layer 24 may be interposed between the first and second substrates 10 and 30.

The first semiconductor chip 50 may include a first chip body 51, first chip conductive pads 53 on a bottom surface of the first chip body 51, and a first chip passivation layer 55 covering the bottom surface of the first chip body 51. Although not specifically illustrated in FIGS. 1-5, the first chip body 51 may include a plurality of transistors and connection lines disposed on a semiconductor substrate. The first chip conductive pads 53 may include metal (e.g., aluminum or copper). The first chip passivation layer 55 may be formed of, for example, a silicon nitride layer or a polyimide layer. The first chip conductive pads 53 may be electrically connected through second internal connection terminals 40 to corresponding ones of the second substrate upper conductive patterns 33. The second internal connection terminals 40 may be solder balls, conductive bumps, conductive pillars, or any combination thereof. The second internal connection terminals 40 may include one or more of copper, tin, or lead. A second under-fill layer 42 may be interposed between the first semiconductor chip 50 and the second substrate 30. The first semiconductor chip 50 may include a first chip right-side wall 50sr adjacent to the second semiconductor chip 60 and a first chip left-side wall 50sl opposite to the first chip right-side wall 50sr. As shown in FIG. 1, the first semiconductor chip 50 may further include a first chip front-side wall 50sf that connects the first chip right-side wall 50sr to the first chip left-side wall 50sl at a front side of the first semiconductor chip 50, and a first chip back-side wall 50sb that is opposite to the first chip front-side wall 50sf and connects the first chip right-side wall 50sr to the first chip left-side wall 50sl at a back (or rear) side of the first semiconductor chip 50. The first semiconductor chip 50 may have a top surface 50u spaced apart at a first distance D1 from a top surface of the second substrate 30.

The second semiconductor chip 60 may include a second chip body 61, second chip conductive pads 63 on a bottom surface of the second chip body 61, and a second chip passivation layer 65 covering the bottom surface of the second chip body 61. Although not specifically illustrated in FIGS. 1-5, the second chip body 61 may include a plurality of transistors and connection lines disposed on a semiconductor substrate. The second chip conductive pads 63 may include metal (e.g., aluminum or copper). The second chip passivation layer 65 may be formed of, for example, a silicon nitride layer or a polyimide layer. The second chip conductive pads 63 may be electrically connected through third internal connection terminals 44 to corresponding ones of the second substrate upper conductive patterns 33. The third internal connection terminals 44 may be solder balls, conductive bumps, conductive pillars, or any combination thereof. The third internal connection terminals 44 may include one or more of copper, tin, or lead. A third under-fill layer 46 may be interposed between the second semiconductor chip 60 and the second substrate 30. The second semiconductor chip 60 may include a second chip left-side wall 60sl adjacent to the first semiconductor chip 50 and a second chip right-side wall 60sr opposite to the second chip left-side wall 60sl. As shown in FIG. 1, the second semiconductor chip 60 may further include a second chip front-side wall 60sf that connects the second chip right-side wall 60sr to the second chip left-side wall 60sl at a front side of the second semiconductor chip 60, and a second chip back-side wall 60sb that is opposite to the second chip front-side wall 60sf and connects the second chip right-side wall 60sr to the second chip left-side wall 60sl at a back (or rear) side of the first semiconductor chip 50. The second semiconductor chip 60 may have a top surface 60u spaced apart at a second distance D2 from the top surface of the second substrate 30.

The first distance D1 may be equal to the second distance D2. For example, the top surface 50u of the first semiconductor chip 50 may be located at the same height (or level) as that of the top surface 60u of the second semiconductor chip 60.

The first and second semiconductor chips 50 and 60 may be each independently selected from a system LSI (large scale integration), a logic circuit, an image sensor (e.g., CIS (CMOS image sensor), a MEMS (microelectromechanical system) device, an ASIC (application specific integrated circuit) device, and a memory device (e.g., Flash memory, DRAM, SRAM, EEPROM, PRAM, MRAM, ReRAM, HBM (high bandwidth memory), or HMC (hybrid memory cubic)).

The first, second, and third under-fill layers 24, 42, and 46 may include a thermosetting resin or a photosensitive resin. The first, second, and third under-fill layers 24, 42, and 46 may further include an organic or inorganic filler. The second under-fill layer 42 may be spaced apart from the third under-fill layer 46. The second under-fill layer 42 may include a second under-fill protrusion 42a that protrudes beyond the first chip right-side wall 50sr of the first semiconductor chip 50. The third under-fill layer 46 may include a third under-fill protrusion 46a that protrudes beyond the second chip left-side wall 60sl of the second semiconductor chip 60.

The heat sink 80 may be, for example, a metal plate. The thermal interface material layer 70 may include, for example, a thermosetting resin layer. The thermal interface material layer 70 may further include filler particles (not shown) distributed in the thermosetting resin layer. The filler particles may include one or more of silica, alumina, zinc oxide, or boron nitride. The thermal interface material layer 70 may include first to sixth thermal interface material segments 70a to 70f. The first to sixth thermal interface material segments 70a to 70f may constitute a single body. The first thermal interface material segment 70a may be interposed between the heat sink 80 and the top surface 50u of the first semiconductor chip 50. The second thermal interface material segment 70b may be interposed between the heat sink 80 and the top surface 60u of the second semiconductor chip 60. The third thermal interface material segment 70c may be interposed between the first chip right-side wall 50sr of the first semiconductor chip 50 and the second chip left-side wall 60sl of the second semiconductor chip 60. The third thermal interface material segment 70c may have an upper surface at the same height as either the top surface 50u of the first semiconductor chip 50 or the top surface 60u of the second semiconductor chip 60. The fourth thermal interface material segment 70d may be interposed vertically between the third thermal interface material segment 70c and the heat sink 80. The fourth thermal interface material segment 70d may also be interposed horizontally between the first and second thermal interface material segments 70a and 70b. The fifth thermal interface material segment 70e may protrude beyond the first chip left-side wall 50sl of the first semiconductor chip 50. The sixth thermal interface material segment 70f may protrude beyond the second chip right-side wall 60sr of the second semiconductor chip 60.

As shown in FIG. 1, the fifth thermal interface material segment 70e may extend to protrude beyond the first chip front-side wall 50sf. The fifth thermal interface material segment 70e may also protrude beyond the first chip back-side wall 50sb. The sixth thermal interface material segment 70f may extend to protrude beyond the second chip front-side wall 60sf. The sixth thermal interface material segment 70f may also protrude beyond the second chip back-side wall 60sb. The fourth thermal interface material segment 70d may extend to lie between the first and sixth thermal interface material segments 70a and 70f. The third thermal interface material segment 70c may lie between the first and sixth thermal interface material segments 70a and 70f.

A third distance D3 from the top surface of the second substrate 30 to a lowest point of a bottom surface of the third thermal interface material segment 70c may be less than a fourth distance D4 from the top surface of the second substrate 30 to a lowest point of a bottom surface of the fifth thermal interface material segment 70e. A fifth distance D5 from the top surface of the second substrate 30 to a lowest point of a bottom surface of the sixth thermal interface material segment 70f may be greater than the third distance D3. In some example embodiments, the third distance D3 may be less than each of the fourth and fifth distances D4 and D5. The fourth distance D4 may be equal or substantially similar to the fifth distance D5. Any of the third, fourth, and fifth distances D3, D4, and D5 may be less than the first and second distances D1 and D2. The first and second semiconductor chips 50 and 60 may be spaced apart from each other at a sixth distance D6 equal to or less than, for example, about 1 mm. The thermal interface material layer 70 may have different thicknesses depending on position. For example, as illustrated in FIG. 5, a seventh distance D7 or a minimum distance from the lowest point of the bottom surface of the fifth thermal interface material segment 70e to the heat sink 80 may be less than an eighth distance D8 or a minimum distance from the lowest point of the bottom surface of the third thermal interface material segment 70c to the heat sink 80. The thermal interface material layer 70 may be thickest between the first semiconductor chip 50 and the second semiconductor chip 60, and thinnest between the heat sink 80 and the first semiconductor chip 50 or between the heat sink 80 and the second semiconductor chip 60. A thickness of the thermal interface material layer 70 between the first and second semiconductor chips 50 and 60 may correspond to a sum of thicknesses of the third and fourth thermal interface material segments 70c and 70d.

Referring to FIGS. 2 to 5, a gap region AR1 may be provided between the first and second semiconductor chips 50 and 60. An upper end of the gap region AR1 may be limited either by the height of the top surface 50u of the first semiconductor chip 50 or by the height of the top surface 60u of the second semiconductor chip 60. A lower end of the gap region AR1 may be limited by the top surface of the second substrate 30. One side of the gap region AR1 may be limited by the first chip right-side wall 50sr of the first semiconductor chip 50. Another side of the gap region AR1, which is opposite to the one side of the gap region AR1, may be limited by the second chip left-side wall 60sl of the second semiconductor chip 60.

The gap region AR1 may have therein an empty space AG1 that is not occupied by the third thermal interface material segment 70c, the second under-fill protrusion 42a, and the third under-fill protrusion 46a. The empty space AG1 may separate the third thermal interface material segment 70c from the second and third under-fill protrusions 42a and 46a. In such cases, the empty space AG1 may be present between the third thermal interface material segment 70c, the second under-fill protrusion 42a, and the third under-fill protrusion 46a.

The thermal interface material layer 70 may have different physical properties (e.g., thermal expansion coefficient or elastic modulus) from those of the second and third under-fill layers 42 and 46. The fabrication of the semiconductor package 100 may undergo a temperature variation, for example, between room temperature and about 200° C. When the thermal interface material layer 70 contacts any of the second under-fill protrusion 42a or the third under-fill protrusions 46a in the gap region AR1, one or more of the second under-fill layer 42 or the third under-fill layer 46 may suffer from cracks due to stress resulting from a difference in physical properties between the thermal interface material layer 70, the second under-fill protrusion 42a, and the third under-fill protrusion 46a. For example, a crack may be generated at an interface between the second substrate 30 and one or more of the second under-fill layer 42 or the third under-fill layer 46. In case that the crack is generated, the degree of cracking may considerably increase due to a rapid temperature variation during a subsequent test process on semiconductor packages. Thus, a problem such as a bump-open (referring to a problem that one or ones of the second and third internal connection terminals 40 and 44 are disconnected from the second substrate upper conductive patterns 33) may occur.

However, according to the present inventive concepts, because the empty space AG1 separates the third thermal interface material segment 70c from the second and third under-fill protrusions 42a and 46a, even when the semiconductor packages undergo the temperature variation, the crack issue may be mitigated or avoided due to no occurrence of stress between the third thermal interface material segment 70c and the second and third under-fill protrusions 42a and 46a. Accordingly, the semiconductor package 100 may improve in reliability.

A sum of volumes of the third thermal interface material segment 70c, the second under-fill protrusion 42a, and the third under-fill protrusion 46a that are positioned in the gap region AR1 may be equal to or less than about 90% of a total volume of the gap region AR1. A volume of the empty space AG1 in the gap region AR1 between the first and second semiconductor chips 50 and 60 may be equal to or greater than about 10% of the total volume of the gap region AR1. If these conditions are satisfied, even when the thermal interface material layer 70, the second under-fill layer 42, and the third under-fill layer 46 are thermally expanded during fabrication and testing of semiconductor packages, the empty space AG1 may still exist and separate the third thermal interface material segment 70c from the second and third under-fill protrusions 42a and 46a. Thus, the semiconductor package 100 may exhibit improved reliability.

Figure 6:
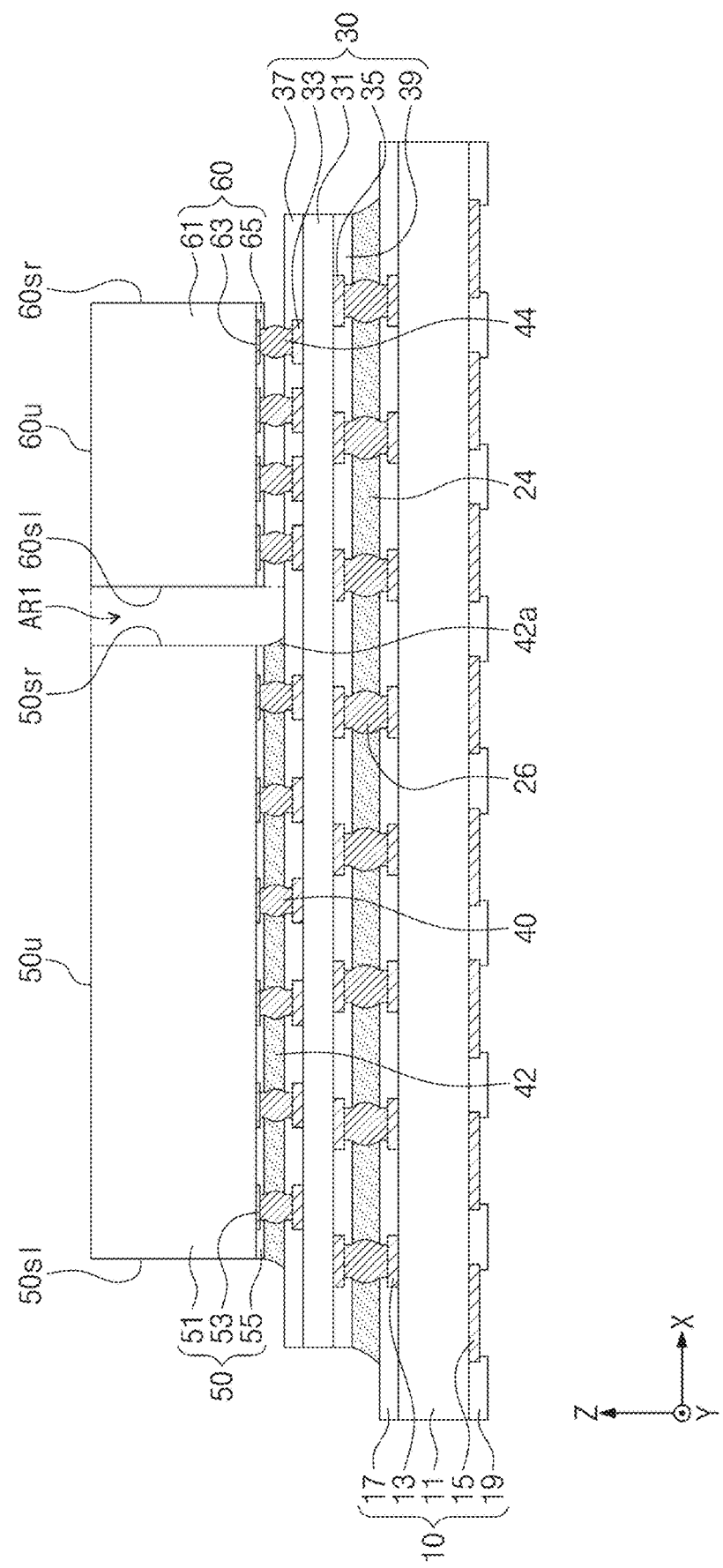
FIG. 6 illustrates a cross-sectional view showing a method of fabricating a semiconductor package in conjunction with FIG. 2.

FIG. 6 illustrates a cross-sectional view showing a method of fabricating a semiconductor package in conjunction with FIG. 2.

Referring to FIG. 6, a first substrate 10 may be prepared. The first substrate 10 may include a first core 11, first substrate upper conductive patterns 13 on a top surface of the first core 11, a first substrate upper passivation layer 17 covering the top surface of the first core 11, first substrate lower conductive patterns 15 on a bottom surface of the first core 11, and a first substrate lower passivation layer 19 covering the bottom surface of the first core 11. A second substrate 30 may be attached to the first substrate 10 with one or more first internal connection terminals 26 interposed therebetween. The second substrate 30 may include a second core 31, second substrate upper conductive patterns 33 on a top surface of the second core 31, a second substrate upper passivation layer 37 covering the top surface of the second core 31, second substrate lower conductive patterns 35 on a bottom surface of the second core 31, and a second substrate lower passivation layer 39 covering the bottom surface of the second core 31.

A first under-fill layer 24 may be formed between the first and second substrates 10 and 30. For example, the first under-fill layer 24 may be formed by providing a thermosetting or photosensitive resin solution into a space between the first and second substrates 10 and 30, and then curing the resin solution. A first semiconductor chip 50 may be mounted on the second substrate 30 with one or more second internal connection terminals 40 interposed therebetween. A second under-fill layer 42 may be formed between the first semiconductor chip 50 and the second substrate 30. Similarly to the formation of the first under-fill layer 24, the second under-fill layer 42 may be formed by providing a thermosetting or photosensitive resin solution into a space between the second substrate 30 and the first semiconductor chip 50, and then curing the resin solution. A portion of the second under-fill layer 42 may protrude beyond a first chip right-side wall 50sr of the first semiconductor chip 50, thereby forming a second under-fill protrusion 42a. A second semiconductor chip 60 may be mounted on the second substrate 30 with one or more third internal connection terminals 44 interposed therebetween.

FIG. 6 shows a dotted line that indicates a gap region AR1 between the first and second semiconductor chips 50 and 60. The second under-fill protrusion 42a may be present in the gap region AR1 shown in FIG. 6.

Subsequently, referring to FIG. 2, a third under-fill layer 46 may be formed between the second semiconductor chip 60 and the second substrate 30. A resin solution may be coated on a top surface 50u of the first semiconductor chip 50 and a top surface 60u of the second semiconductor chip 60, and then cured at a temperature of about 200° C. while a jig or the like presses down a heat sink 80 covering the resin solution, to provide a thermal interface material layer 70. In this step, the resin solution may be pressed downwardly and then compelled to move outwardly beyond edges of the first and second semiconductor chips 50 and 60. The outward movement of the resin solution may form third, fourth, fifth, and sixth thermal interface material segments 70c, 70d, 70e, and 70f. As semiconductor packages are highly integrated, a spacing between the first and second semiconductor chips 50 and 60 may be reduced such that the resin solutions pushed outwardly beyond the edges of the first and second semiconductor chips 50 and 60 may be connected to cause the thermal interface material layer 70 to have a relatively large thickness between the first and second semiconductor chips 50 and 60. The aforementioned processes may fabricate a semiconductor package 100 configured as shown in FIG. 2. A lower end of the heat sink 80 may be attached through the adhesive layer 82 to a top surface of the first substrate 10. The adhesive layer 82 may include the same material as that of the thermal interface material layer 70. The adhesive layer 82 and the thermal interface material layer 70 may be formed at the same time. Subsequently, external connection terminals 22 may be attached to the first substrate lower conductive patterns 15.

According to the example embodiment, because the empty space AG1 separates the third thermal interface material segment 70c from the second and third under-fill protrusions 42a and 46a, even when the fabrication of the semiconductor package 100 undergoes the temperature variation, the crack issue may be mitigated or avoided due to no occurrence of stress between the third thermal interface material segment 70c and the second and third under-fill protrusions 42a and 46a. Thus, the semiconductor package 100 may improve in reliability, decrease in defect rate, and/or increase in manufacturing yield.

Figure 7:
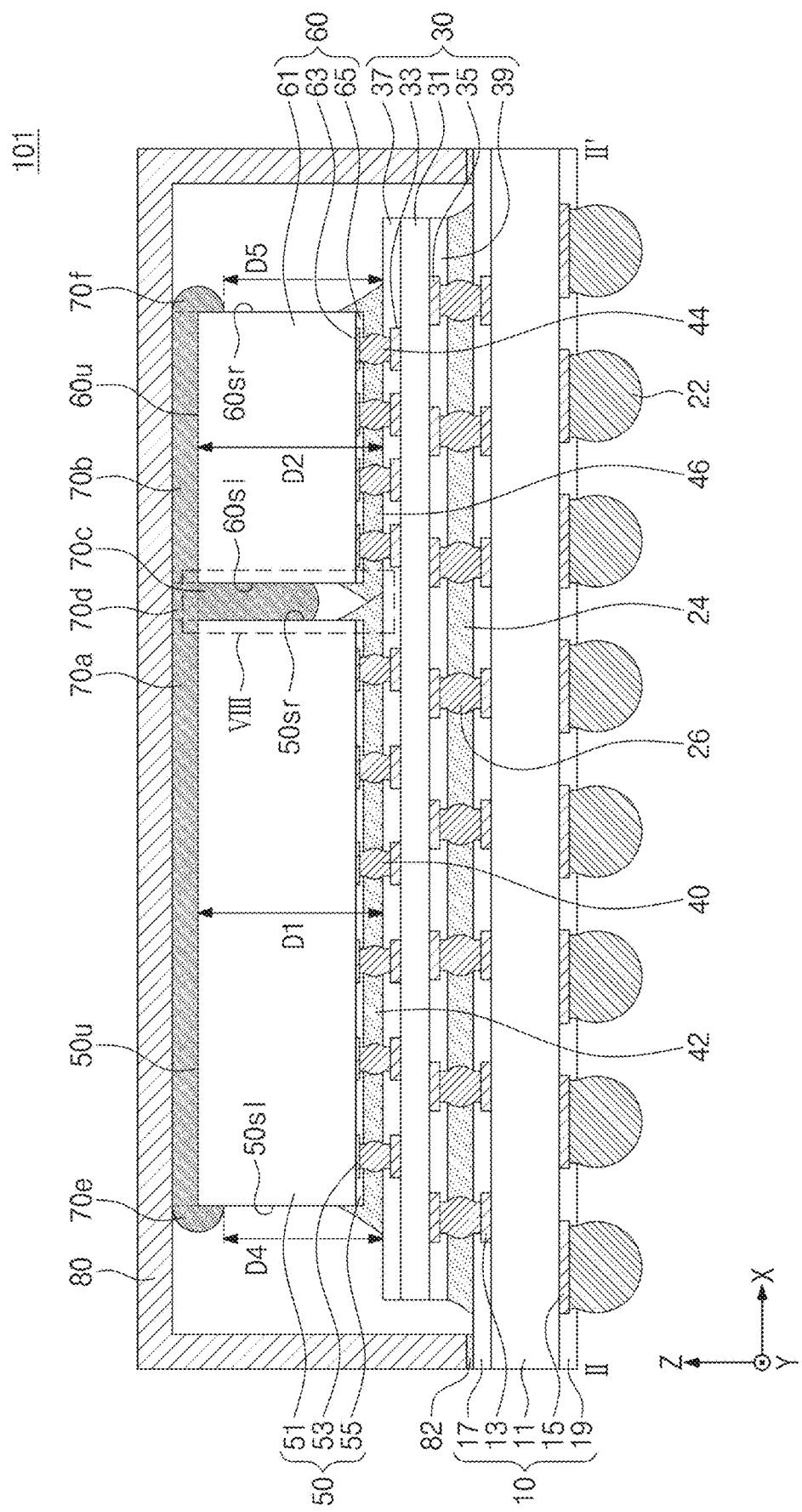
FIG. 7 illustrates a cross-sectional view of a semiconductor package taken along line II-II' of FIG. 1, according to an example embodiment of the present inventive concepts.
Figure 8:
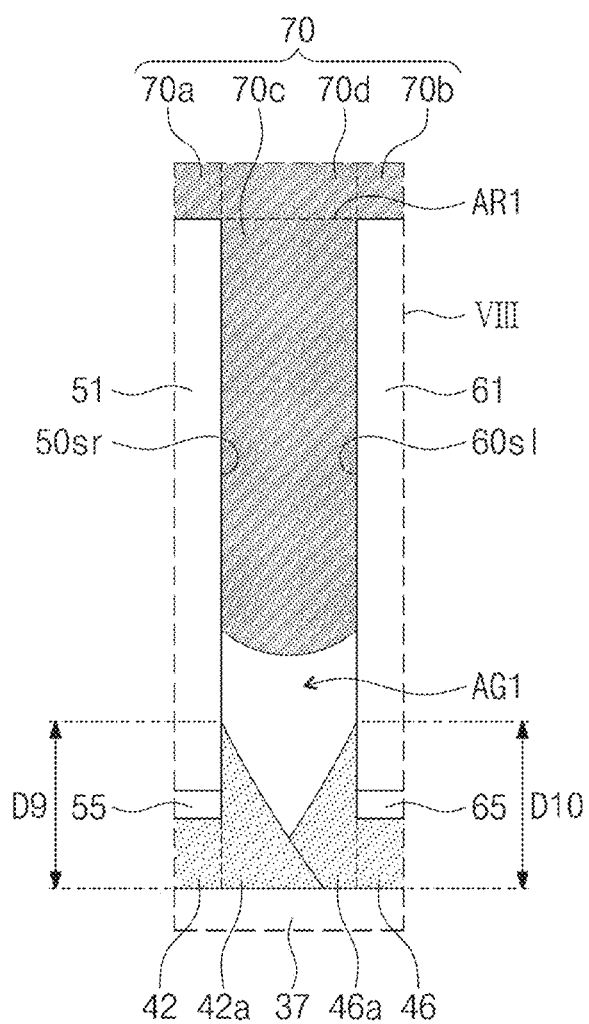
FIG. 8 illustrates an enlarged view showing section VIII of FIG. 7.

FIG. 7 illustrates a cross-sectional view showing a semiconductor package taken along line II-II' of FIG. 1, according to an example embodiment of the present inventive concepts. FIG. 8 illustrates an enlarged view showing section VIII of FIG. 7.

Referring to FIGS. 7 and 8, a semiconductor package 101 may be configured such that the second under-fill protrusion 42a may extend to contact the first chip right-side wall 50sr of the first semiconductor chip 50. The third under-fill protrusion 46a may extend to contact the second chip left-side wall 60sl of the second semiconductor chip 60. The second under-fill protrusion 42a may also contact the third under-fill protrusion 46a. A ninth distance D9 may be provided between the top surface of the second substrate 30 and an upper end of the second under-fill protrusion 42a. The ninth distance D9 may be equal to or less than about 50% of the first distance D1. A tenth distance D10 may be provided between the top surface of the second substrate 30 and an upper end of the third under-fill protrusion 46a. The tenth distance D10 may be equal to or less than about 50% of the first distance D1. In the gap region AR1, the third thermal interface material segment 70c may have a relatively large volume compared to the case of the semiconductor package 100 of FIG. 2. Nevertheless, the empty space AG1 may still exist and separate the third thermal interface material segment 70c from the second and third under-fill protrusions 42a and 46a when the thermal interface material layer 70, the second under-fill layer 42, and the third under-fill layer 46 thermally expand during fabrication and testing of semiconductor packages. Thus, the semiconductor package 101 may have improved reliability. Other configurations may be identical or substantially similar to those discussed with reference to FIGS. 1 to 5.

Figure 9:
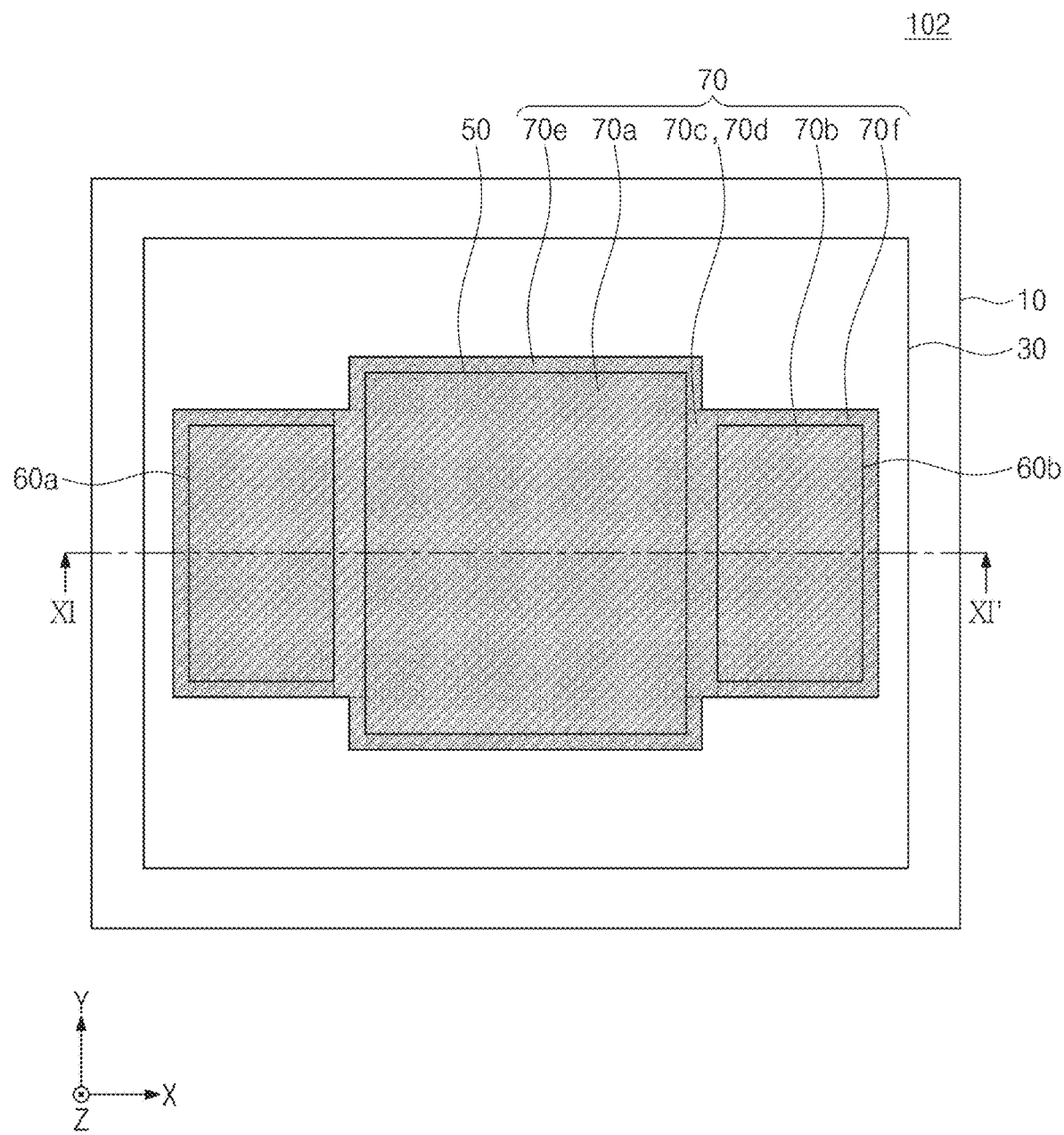
FIGS. 9 and 10 illustrate plan views showing semiconductor packages according to some example embodiments of the present inventive concepts.
Figure 10:
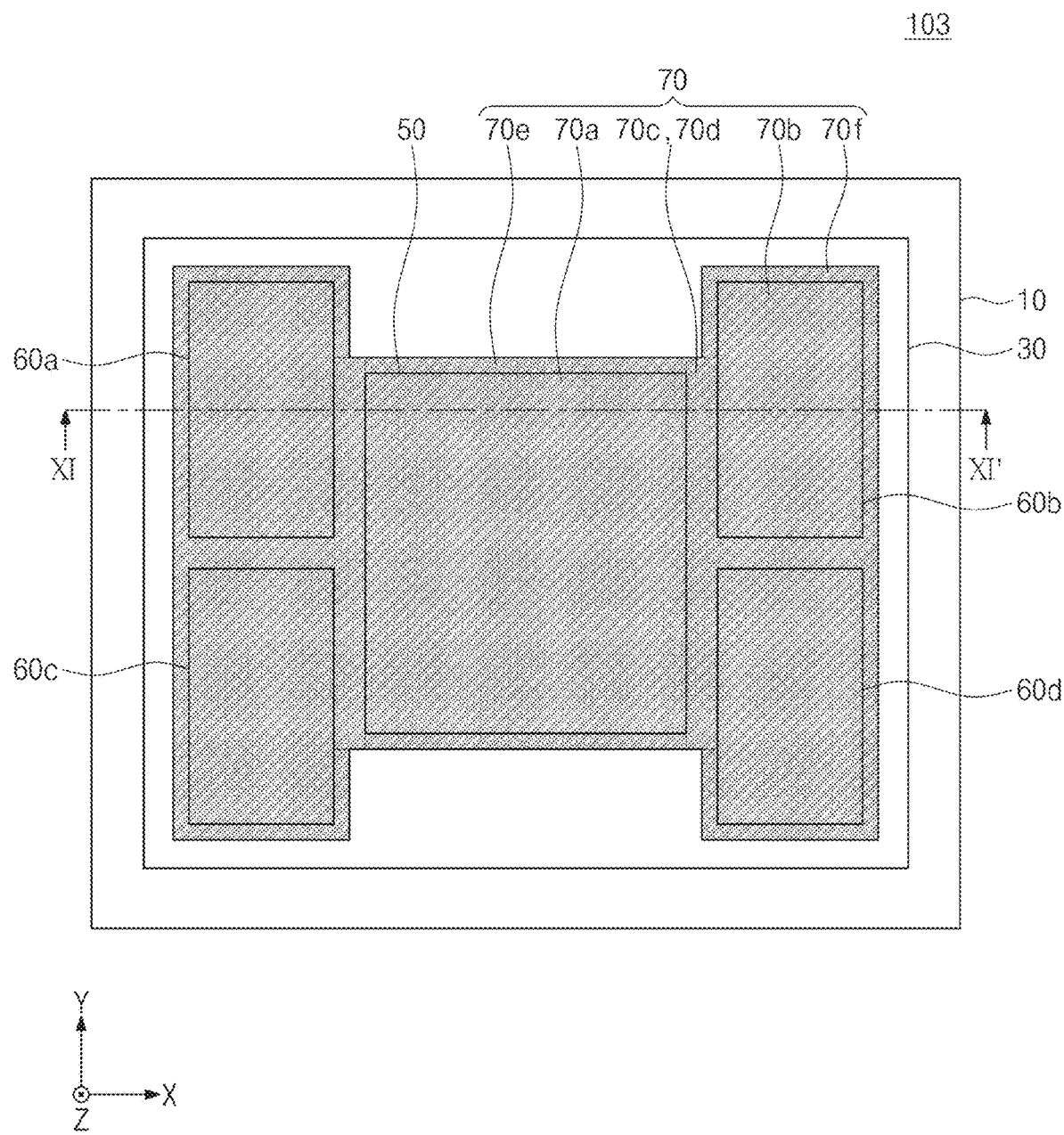
Figure 11:
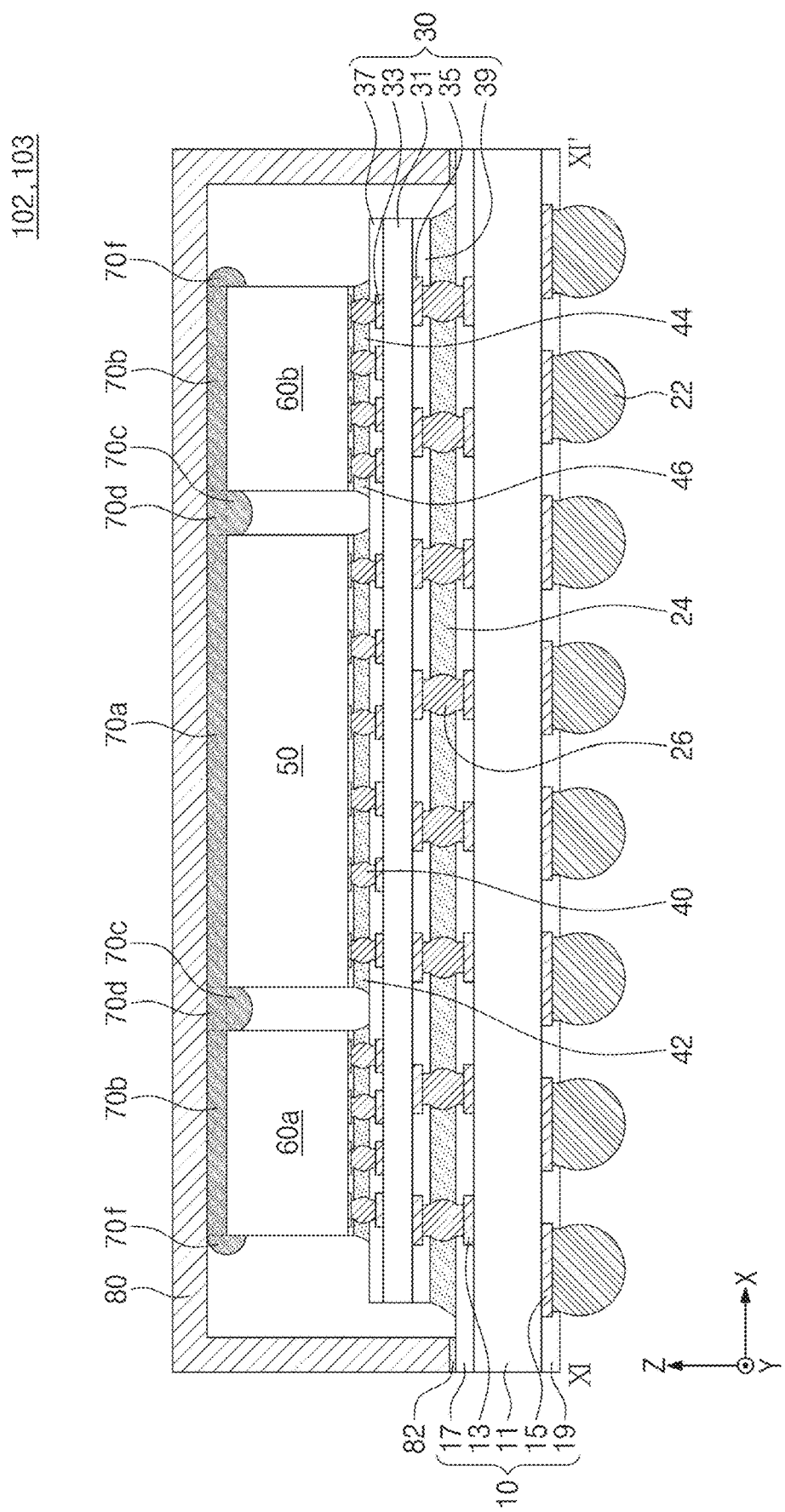
FIG. 11 illustrates a cross-sectional view taken along line XI-XI' of FIG. 9 or 10.

FIGS. 9 and 10 illustrate plan views showing semiconductor packages according to some example embodiments of the present inventive concepts. FIG. 11 illustrates a cross-sectional view taken along line XI-XI' of FIG. 9 or 10.

Referring to FIGS. 9 and 11, a semiconductor package 102 may be configured such that the first semiconductor chip 50 may be mounted on a central portion of the second substrate 30 and second semiconductor chips 60a and 60b may be mounted on the second substrate 30 and on opposite sides of the first semiconductor chip 50. The second semiconductor chips 60a and 60b may include a first second-semiconductor-chip 60a and a second second-semiconductor-chip 60b. The third thermal interface material segment 70c may be disposed between the first second-semiconductor-chip 60a and the first semiconductor chip 50 and between the second-semiconductor-chip 60b and the first semiconductor chip 50. The first second-semiconductor-chip 60a and the second second-semiconductor-chip 60b may have the same function or different functions from each other. Other configurations may be identical or substantially similar to those discussed with reference to FIGS. 1 to 5.

Referring to FIGS. 10 and 11, a semiconductor package 103 may be configured such that the first semiconductor chip 50 may be mounted on a central portion of the second substrate 30, and second semiconductor chips 60a, 60b, 60c, and 60d may be mounted on the second substrate 30 and at opposite sides of the first semiconductor chip 50. The second semiconductor chips 60a, 60b, 60c, and 60d may include a first second-semiconductor-chip 60a, a second second-semiconductor-chip 60b, a third second-semiconductor-chip 60c, and a fourth second-semiconductor-chip 60d. The first and third second-semiconductor-chips 60a and 60c may be disposed adjacent to one side of the first semiconductor chip 50. The second and fourth second-semiconductor-chips 60b and 60d may be disposed adjacent to another side of the first semiconductor chip 50, which is opposite to the one side of the first semiconductor chip 50. The second semiconductor chips (alternatively, the first to fourth second-semiconductor-chips) 60a, 60b, 60c, and 60d may be spaced apart from each other. The second semiconductor chips 60a, 60b, 60c, and 60d may have the same function or different functions from each other. Other configurations may be identical or substantially similar to those discussed with reference to FIGS. 1 to 5.

Figure 12:
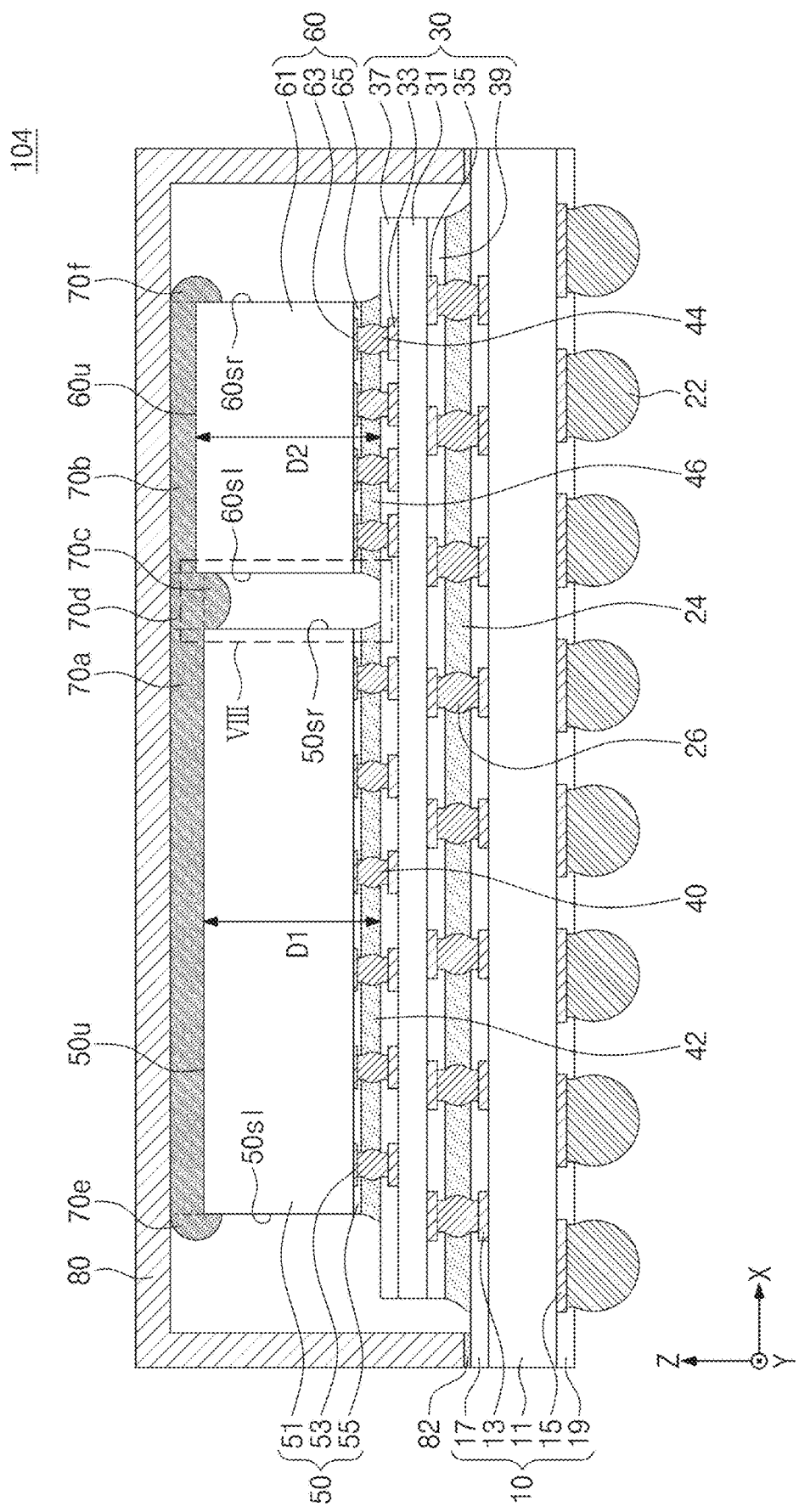
FIG. 12 illustrates a cross-sectional view showing a semiconductor package according to an example embodiment of the present inventive concepts.
Figure 13:
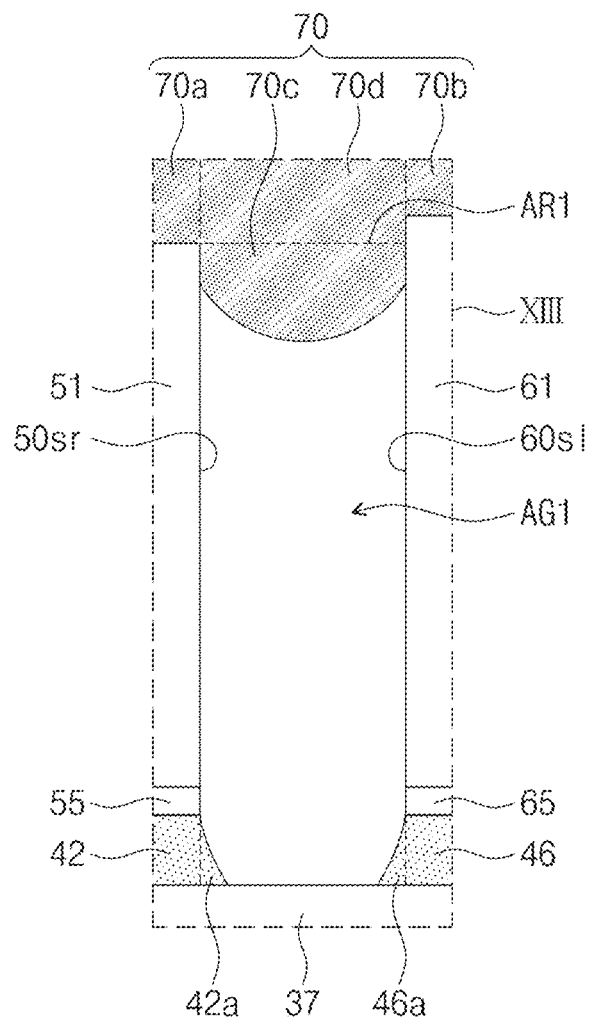
FIGS. 13 and 14 illustrate enlarged views showing section XIII of FIG. 12.
Figure 14:
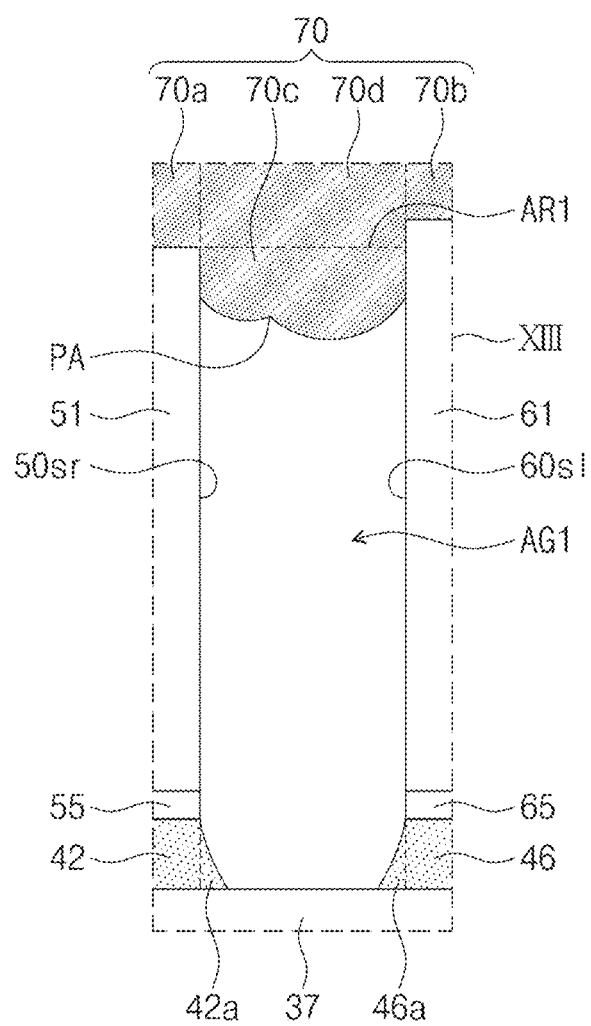

FIG. 12 illustrates a cross-sectional view showing a semiconductor package according to an example embodiment of the present inventive concepts. FIGS. 13 and 14 illustrate enlarged views showing section XIII of FIG. 12.

Referring to FIGS. 12 and 13, a semiconductor package 104 may be configured such that the first distance D1 may be different from the second distance D2. For example, the first distance D1 may be less than the second distance D2. In such cases, the top end of the gap region AR1 may be limited by the height of the top surface 50u of the first semiconductor chip 50. The fourth thermal interface material segment 70d may cover an upper portion of the second chip left-side wall 60sl of the second semiconductor chip 60.

If the second distance D2 is less than the first distance D1, the top end of the gap region AR1 may be limited by the height of the top surface 60u of the second semiconductor chip 60. The fourth thermal interface material segment 70d may cover an upper portion of the first chip right-side wall 50sr of the first semiconductor chip 50. Other configurations may be identical or substantially similar to those discussed with reference to FIGS. 1 to 5.

Referring to FIG. 14, a cross-section of the third thermal interface material segment 70c may have an inflection point PA. For another example, the third thermal interface material segment 70c may have a bottom surface with a groove. Because the first and second distances D1 and D2 are different from each other, a resin solution for forming the thermal interface material layer 70 may be non-uniformly pressed under the heat sink 80 covering the resin solution. Thus, the inflection point PA or the groove may be formed on a lower surface of the thermal interface material layer 70. When the first distance D1 is less than the second distance D2, the inflection point PA may be nearer to the first semiconductor chip 50 than to the second semiconductor chip 60. When the first distance D1 is greater than the second distance D2, the inflection point PA may be nearer to the second semiconductor chip 60 than to the first semiconductor chip 50. Other configurations may be identical or substantially similar to those discussed with reference to FIGS. 12 and 13.

Figure 15:
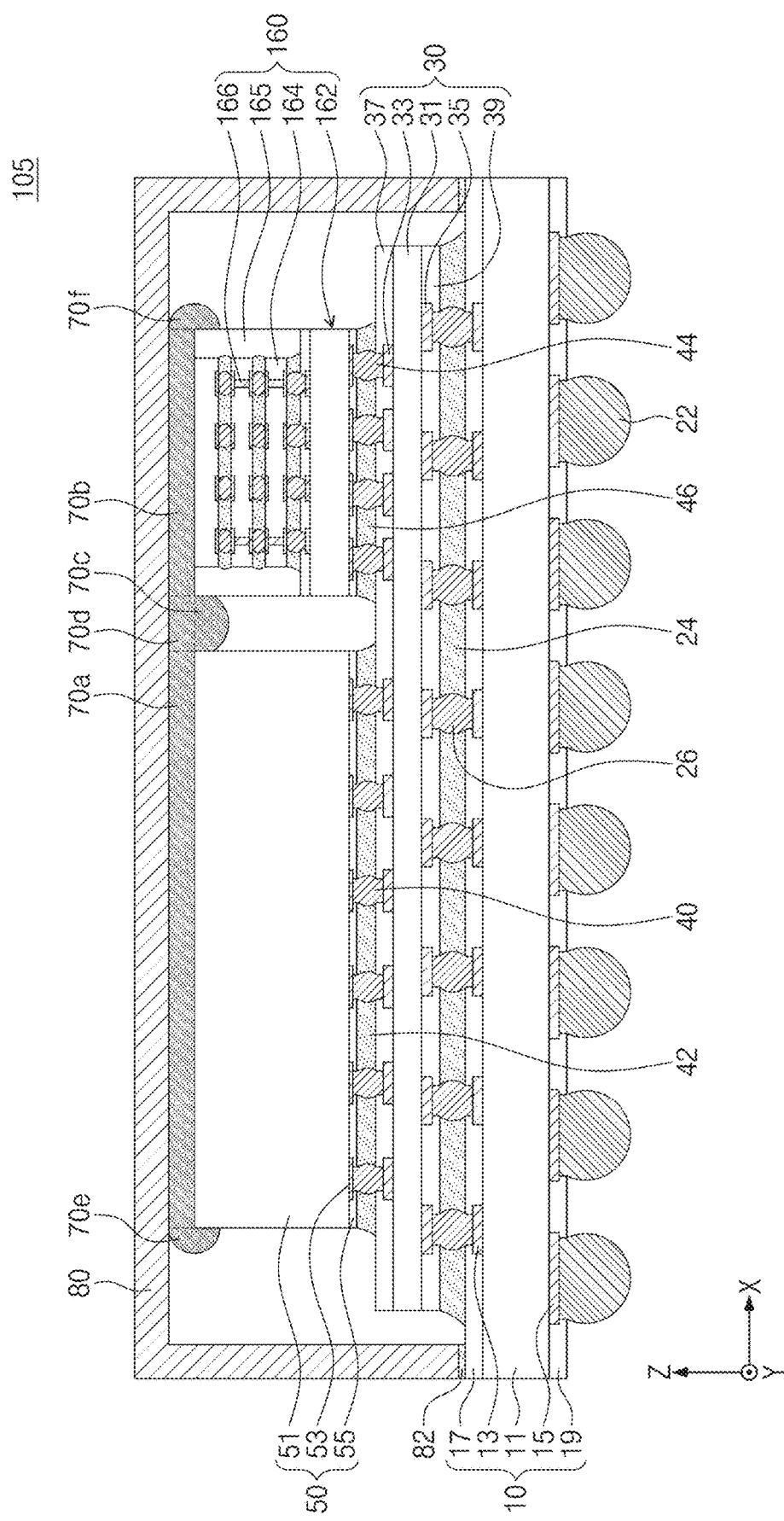
FIGS. 15 to 17 illustrate cross-sectional views showing semiconductor packages according to some example embodiments of the present inventive concepts.
Figure 16:
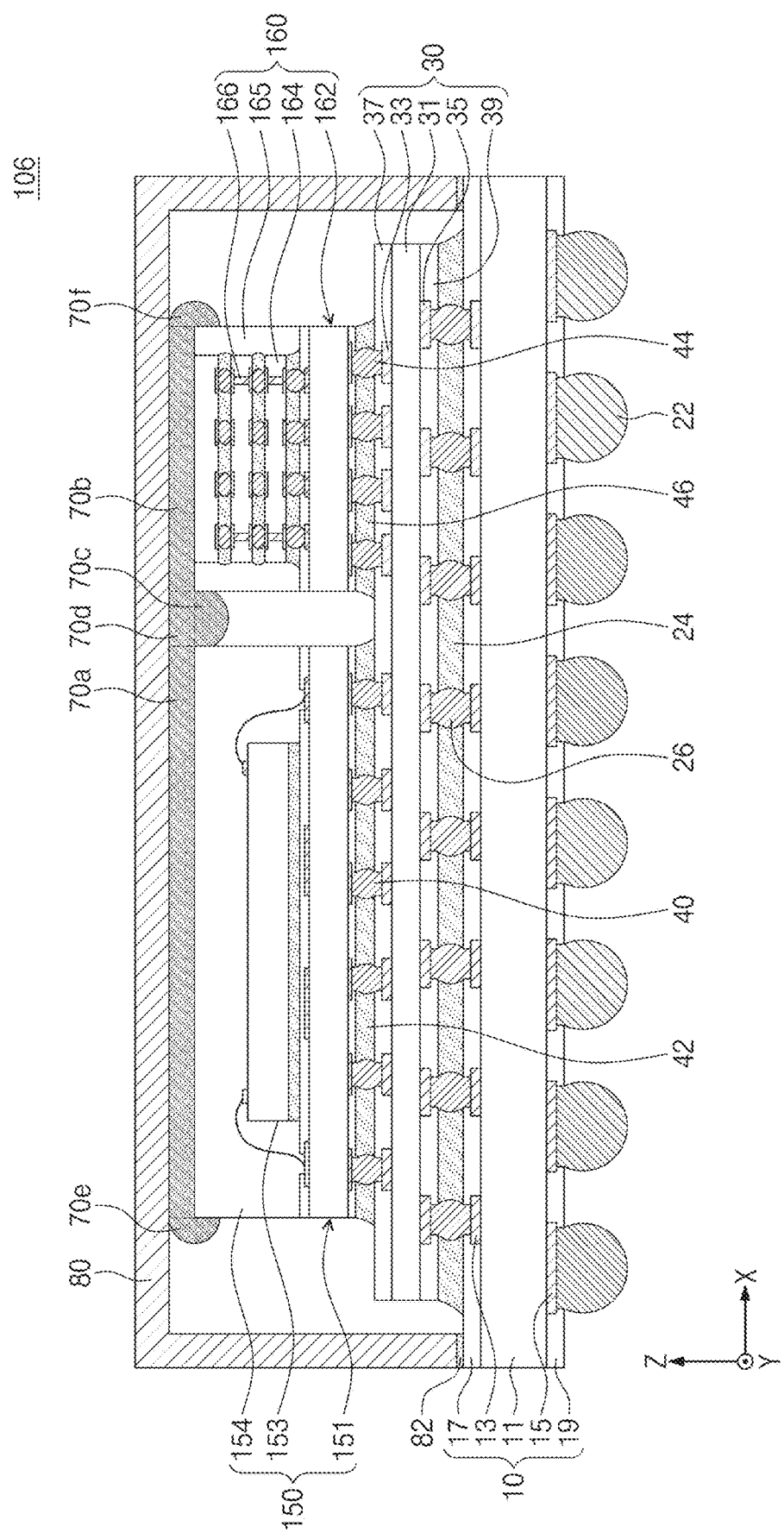
Figure 17:
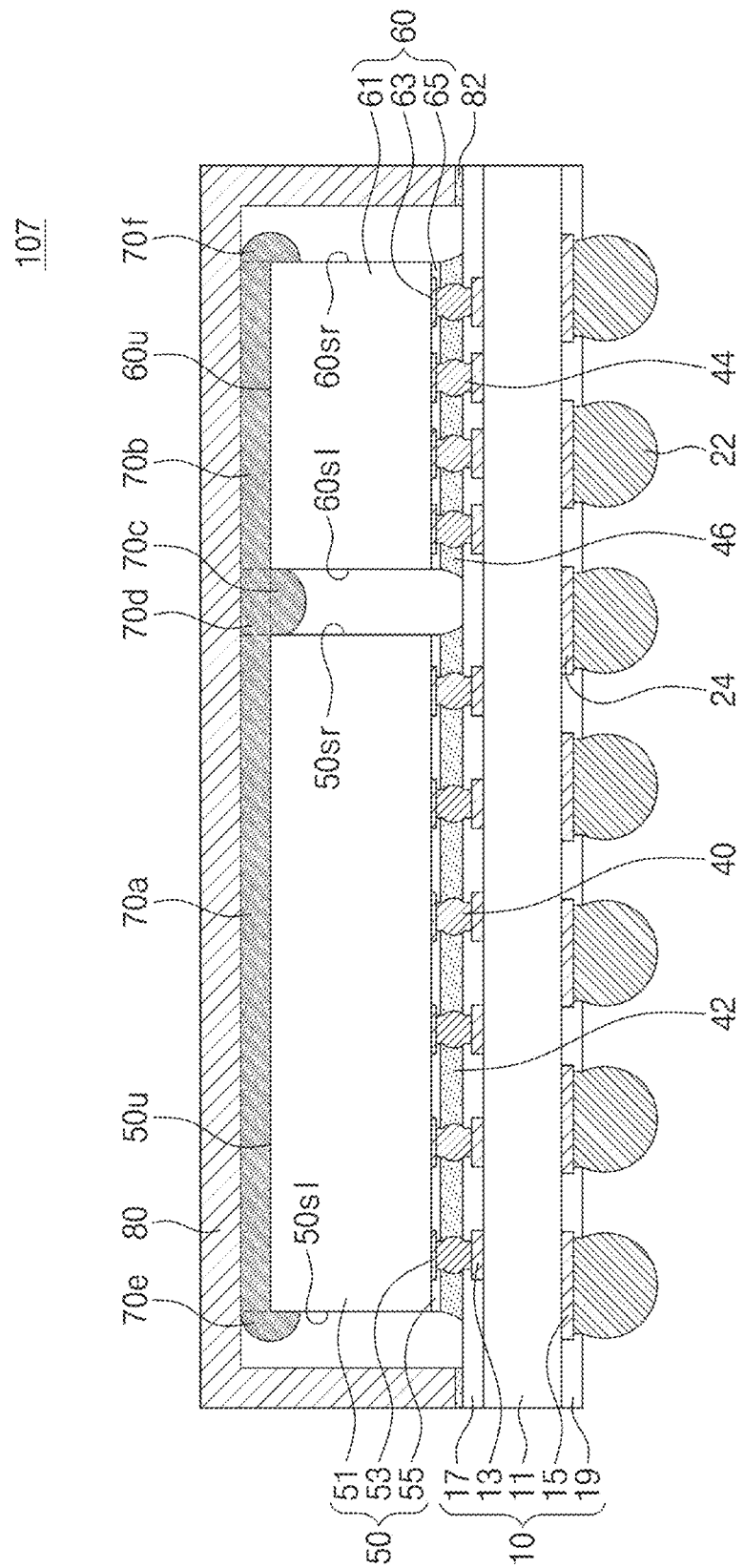

FIGS. 15 to 17 illustrate cross-sectional views showing semiconductor packages according to some example embodiments of the present inventive concepts.

Referring to FIG. 15, a semiconductor package 105 may be configured such that a second sub-semiconductor package 160 may be mounted on the second substrate 30 with the third internal connection terminals 44 interposed therebetween. The second sub-semiconductor package 160 may be spaced apart from the first semiconductor chip 50. The second sub-semiconductor package 160 may include a second sub-package substrate 162 and a plurality of second semiconductor chips 164 that are sequentially stacked on the second sub-package substrate 162. The second semiconductor chips 164 may include through electrodes 166 therein. The second semiconductor chips 164 may be stacked in a flip-chip bonding manner. A second sub-mold layer 165 may cover sidewalls of the second semiconductor chips 164 and a top surface of the second sub-package substrate 162. An uppermost one of the second semiconductor chips 164 may have a top surface coplanar with that of the second sub-mold layer 165. The second thermal interface material segment 70b of the thermal interface material layer 70 may directly contact the uppermost second sub-semiconductor chip 164. In such cases, heat generated from the uppermost second semiconductor chips 164 may be discharged outwardly through the thermal interface material layer 70. Other configurations may be identical or substantially similar to those discussed with reference to FIGS. 1 to 5.

Referring to FIG. 16, a semiconductor package 106 may be configured such that a first sub-semiconductor package 150 may be mounted on the second substrate 30 with the second internal connection terminals 40 interposed therebetween. The first sub-semiconductor package 150 may be spaced apart from the second sub-semiconductor package 160. The first sub-semiconductor package 150 may include a first sub-package substrate 151, a first semiconductor chip 153 wire-bonded to the first sub-package substrate 151, and a first sub-mold layer 154 covering the first semiconductor chip 153. Other configurations may be identical or substantially similar to those discussed above with reference to FIG. 15.

Referring to FIG. 17, a semiconductor package 107 is not provided with the second substrate 30 as illustrated in FIGS. 15 and 16, and may be configured such that the first semiconductor chip 50 is directly mounted on the first substrate 10 with the second internal connection terminals 40 interposed therebetween. Further, the second semiconductor chip 60 may be directly mounted on the first substrate 10 with the third internal connection terminals 44 interposed therebetween. Other configurations may be identical or substantially similar to those discussed with reference to FIGS. 1 to 5.

The first semiconductor chip 50 of FIG. 2 and the first sub-semiconductor package 150 of FIG. 16 may each be referred to as a first semiconductor structure. The second semiconductor chip 60 of FIG. 2 and the second sub-semiconductor package 160 of FIG. 16 may each be referred to as a second semiconductor structure.

According to the present inventive concepts, a semiconductor package may include an under-fill layer and a thermal interface material layer that are spaced apart from each other to mitigate or prevent defects (e.g., crack) resulting from a difference in physical properties between the under-fill layer and the thermal interface material layer, thereby improving reliability.

Furthermore, a method of fabricating the semiconductor package may mitigate or prevent defects (e.g., crack) and may increase in manufacturing yield.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. A semiconductor package, comprising:
a package substrate;
an interposer substrate on the package substrate;
a first semiconductor structure, a second semiconductor structure and a third semiconductor structure that are disposed side by side on the interposer substrate;
a heat sink covering the first semiconductor structure, the second semiconductor structure, the third semiconductor structure, the interposer substrate and the package substrate; and
a thermal interface material layer between the first semiconductor structure and the heat sink, between the second semiconductor structure and the heat sink, and between the third semiconductor structure and the heat sink,
wherein the thermal interface material layer has a continuously flat top surface,
wherein the thermal interface material layer comprises a first portion between the first semiconductor structure and the heat sink, a second portion between the second semiconductor structure and the heat sink, and a third portion between the third semiconductor structure and the heat sink, the first to third portions having a first thickness,
wherein the thermal interface material layer further comprises a fourth portion between the first semiconductor structure and the second semiconductor structure,
wherein the fourth portion has a second thickness being greater than the first thickness and a bottom surface of the fourth portion is convex toward the interposer substrate, and
wherein a cross-section of the fourth portion has a profile having an inflection point at the bottom surface thereof between a side of first semiconductor structure and a side the second semiconductor structure.

2. The semiconductor package of claim 1, wherein the bottom surface of the fourth portion has a step difference.

3. The semiconductor package of claim 1, wherein
the first semiconductor structure includes a first sidewall and a second sidewall opposite to the first sidewall, the first sidewall being closer to the second semiconductor structure than the second sidewall,
the thermal interface material layer further comprises a fifth portion that protrudes beyond the second sidewall of the first semiconductor structure, and
a first distance from a top surface of the interposer substrate to a lowest point of the bottom surface of the fourth portion is less than a second distance from the top surface of the interposer substrate to a lowest point of a bottom surface of the fifth portion.

4. The semiconductor package of claim 3, wherein a third distance from the top surface of the interposer substrate to a lowest point of the first portion is greater than the second distance.

5. The semiconductor package of claim 3, further comprising:
a first under-fill layer between the interposer substrate and the first semiconductor structure,
wherein the first under-fill layer includes a first under-fill protrusion that protrudes beyond the first sidewall,
wherein the fourth portion protrudes downwardly to be lower than a top surface of the first semiconductor structure, and
wherein the fourth portion is spaced apart from the first under-fill layer to provide an air gap between the first semiconductor structure and the second semiconductor structure.

6. The semiconductor package of claim 5, wherein a third distance from the top surface of the interposer substrate to a highest point of an upper surface of the first under-fill protrusion is equal to or less than about 50% of a fourth distance from the top surface of the interposer substrate to the top surface of the first semiconductor structure.

7. The semiconductor package of claim 1, wherein the inflection point is closer to the first semiconductor structure than the second semiconductor structure.

8. The semiconductor package of claim 1, wherein the thermal interface material layer further comprises a fifth portion between the second semiconductor structure and the third semiconductor structure, and a bottom surface of the fifth portion has a step difference.

9. The semiconductor package of claim 1, wherein the third semiconductor structure includes a first sidewall and a second sidewall opposite to the first sidewall, the first sidewall being closer to the second semiconductor structure than the second sidewall,
the thermal interface material layer further comprises a fifth portion that protrudes beyond the second sidewall of the first semiconductor structure, and
a first distance from a top surface of the interposer substrate to a lowest point of the bottom surface of the fourth portion is less than a second distance from the top surface of the interposer substrate to a lowest point of a bottom surface of the fifth portion.

10. The semiconductor package of claim 1, wherein the second semiconductor structure has a left-front corner, a left-back corner, a right-back corner and a right-front corner in a clockwise direction in plan view,
the first semiconductor structure is close to the left-back corner and the third semiconductor structure is close to the right-back corner, and
the semiconductor package further comprises a fourth semiconductor structure close to the left-front corner and a fifth semiconductor structure close to the right-front corner.

11. The semiconductor package of claim 10, wherein the first, third, fourth and fifth semiconductor structures each have a same chip of a same function.

12. A semiconductor package, comprising:
a package substrate;
an interposer substrate on the package substrate;
a first semiconductor structure, a second semiconductor structure and a third semiconductor structure that are disposed side by side on the interposer substrate;
a heat sink covering the first semiconductor structure, the second semiconductor structure, the third semiconductor structure, the interposer substrate and the package substrate; and
a thermal interface material layer between the first semiconductor structure and the heat sink, between the second semiconductor structure and the heat sink, and between the third semiconductor structure and the heat sink,
wherein the thermal interface material layer has a continuously flat top surface,
wherein the thermal interface material layer comprises a first portion between the first semiconductor structure and the heat sink, a second portion between the second semiconductor structure and the heat sink, and a third portion between the third semiconductor structure and the heat sink, the first to third portions having a same thickness,
wherein the thermal interface material layer further comprises a fourth portion between the first semiconductor structure and the second semiconductor structure and a fifth portion between the second semiconductor structure and the third semiconductor structure,
wherein the first semiconductor structure includes a first sidewall and a second sidewall opposite to the first sidewall, the first sidewall being closer to the second semiconductor structure than the second sidewall,
wherein the thermal interface material layer further comprises a sixth portion that protrudes beyond the second sidewall of the first semiconductor structure,
wherein a first distance from a top surface of the interposer substrate to a lowest point of a bottom surface of the fourth portion or the fifth portion is less than a second distance from the top surface of the interposer substrate to a lowest point of a bottom surface of the sixth portion,
wherein a third distance from the top surface of the interposer substrate to a lowest point of the first portion is greater than the second distance, and
wherein a cross-section of the fourth portion has a profile having an inflection point at the bottom surface thereof between a side of first semiconductor structure and a side the second semiconductor structure.

13. The semiconductor package of claim 12, wherein the bottom surface of the fourth portion has a step difference.

14. The semiconductor package of claim 12, further comprising:
a first under-fill layer between the interposer substrate and the first semiconductor structure,
wherein the first under-fill layer includes a first under-fill protrusion that protrudes beyond the first sidewall,
wherein the fourth portion protruding downwardly to be lower than a top surface of the first semiconductor structure, and
wherein the fourth portion is spaced apart from the first under-fill layer to provide an air gap between the first semiconductor structure and the second semiconductor structure.

15. The semiconductor package of claim 12, wherein the inflection point is closer to the first semiconductor structure than the second semiconductor structure.

16. A semiconductor package, comprising:
a package substrate;
an interposer substrate on the package substrate;
a first semiconductor structure, a second semiconductor structure and a third semiconductor structure that are disposed side by side on the interposer substrate;

a heat sink covering the first semiconductor structure, the second semiconductor structure, the third semiconductor structure, the interposer substrate and the package substrate; and a thermal interface material layer between the first semiconductor structure and the heat sink, between the second semiconductor structure and the heat sink, and between the third semiconductor structure and the heat sink, wherein the thermal interface material layer comprises a first portion between the first semiconductor structure and the heat sink, a second portion between the second semiconductor structure and the heat sink, and a third portion between the third semiconductor structure and the heat sink, wherein the thermal interface material layer further comprises a fourth portion between the first semiconductor structure and the second semiconductor structure, wherein a cross-section of the fourth portion has a profile having an inflection point at a lower surface thereof, and wherein the inflection point is closer to the first semiconductor structure than the second semiconductor structure.

17. The semiconductor package of claim 16, wherein the first to third portions have a same thickness, and the thermal interface material layer has a continuously flat top surface.

18. The semiconductor package of claim 16, wherein a bottom surface of the fourth portion has a step difference.

19. The semiconductor package of claim 16, wherein
the first semiconductor structure includes a first sidewall and a second sidewall opposite to the first sidewall, the first sidewall being closer to the second semiconductor structure than the second sidewall,
the thermal interface material layer further comprises a fifth portion that protrudes beyond the second sidewall of the first semiconductor structure, and
a first distance from a top surface of the interposer substrate to a lowest point of a bottom surface of the fourth portion is less than a second distance from the top surface of the interposer substrate to a lowest point of a bottom surface of the fifth portion.

20. The semiconductor package of claim 19, wherein a third distance from the top surface of the interposer substrate to a lowest point of the first portion is greater than the second distance.

* * * * *